United States Patent
Lee et al.

(10) Patent No.: US 9,530,988 B2
(45) Date of Patent: Dec. 27, 2016

(54) ELECTROSTATIC CHUCK SYSTEM AND METHOD OF MANUFACTURING ORGANIC LIGHT-EMITTING DISPLAY APPARATUS BY USING THE ELECTROSTATIC CHUCK SYSTEM

(71) Applicant: SAMSUNG DISPLAY CO., LTD., Yongin-si, Gyeonggi-do (KR)

(72) Inventors: Duckjung Lee, Yongin-si (KR); Kiyoung Yun, Yongin-si (KR); Jungsun Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/936,585

(22) Filed: Nov. 9, 2015

(65) Prior Publication Data
US 2016/0285052 A1 Sep. 29, 2016

(30) Foreign Application Priority Data
Mar. 26, 2015 (KR) .................. 10-2015-0042366

(51) Int. Cl.
*H01L 51/40* (2006.01)
*H01L 51/56* (2006.01)
(Continued)

(52) U.S. Cl.
CPC .......... *H01L 51/56* (2013.01); *H01L 21/6833* (2013.01); *H01L 27/3244* (2013.01);
(Continued)

(58) Field of Classification Search
CPC ............ H01L 21/6833; H01L 21/0214; H01L 21/28556; H01L 21/02178; H01L 21/048; H01L 21/02332; H01L 21/67103; H01L 27/0248; H01L 27/0814; H01L 27/1251; H01L 29/7869; H01L 29/66603; H01L 29/4908; H01L 51/102; H01L 51/0508; H01L 51/5296; H02N 13/00
(Continued)

(56) References Cited

U.S. PATENT DOCUMENTS 7,806,983 B2 * 10/2010 Chiang .............. C23C 16/0227
  118/724
8,937,800 B2 * 1/2015 Lubomirsky .......... H02N 13/00
  361/234
(Continued)

FOREIGN PATENT DOCUMENTS

JP 2000-21962 A 1/2000
JP 2011-181462 A 9/2011
(Continued)

*Primary Examiner* — David Nhu
(74) *Attorney, Agent, or Firm* — Lewis Roca Rothgerber Christie LLP

(57) ABSTRACT

Provided are an electrostatic chuck system and a method of manufacturing an organic light-emitting display apparatus by using the electrostatic chuck system. The electrostatic chuck system comprises: a stage in which a first electrode and a second electrode are arranged, the first electrode having a first polarity and the second electrode having a second polarity that is different from the first polarity; a display substrate on the stage, the display substrate including a pixel electrode on a surface thereof; and an optical mask over the surface of the display substrate, the optical mask including a reflection layer and a transfer layer to be transferred to the display substrate, wherein the display substrate has one of the first and second polarities, and the optical mask has the other of the first and second polarities as the display substrate.

8 Claims, 6 Drawing Sheets

(51) Int. Cl.
*H01L 21/683* (2006.01)
*H01L 27/32* (2006.01)
*H01L 51/52* (2006.01)
*H02N 13/00* (2006.01)

(52) U.S. Cl.
CPC ......... *H01L 51/5271* (2013.01); *H02N 13/00* (2013.01); *H01L 2227/323* (2013.01)

(58) Field of Classification Search
USPC ..... 438/37, 89, 99, 104, 106, 141, 149, 217, 438/289, 309, 608, 609, 680, 780, 786, 438/798; 257/E21.006, E21.046, E21.047, 257/E21.053, E21.062, E21.126, E21.127, 257/E21.158, E21.17, E21.253, E21.267, 257/E21.278, E21.293, E21.32, E21.347, 257/E21.352, E21.366, E21.411, E21.475
See application file for complete search history.

(56) References Cited

U.S. PATENT DOCUMENTS

| | | |
|---|---|---|
| 2005/0016471 A1 | 1/2005 | Chiang et al. |
| 2009/0059461 A1 | 3/2009 | Yonekura et al. |
| 2013/0279066 A1 | 10/2013 | Lubomirsky et al. |
| 2014/0154819 A1 | 6/2014 | Gaff et al. |
| 2014/0368772 A1* | 12/2014 | Hwang ............. G02F 1/133502 349/106 |
| 2015/0187800 A1* | 7/2015 | Park ..................... H01L 27/124 349/43 |

FOREIGN PATENT DOCUMENTS

| | | |
|---|---|---|
| KR | 10-2009-0023061 A | 3/2009 |
| KR | 10-2009-0105367 A | 10/2009 |

\* cited by examiner

ELECTROSTATIC CHUCK SYSTEM AND METHOD OF MANUFACTURING ORGANIC LIGHT-EMITTING DISPLAY APPARATUS BY USING THE ELECTROSTATIC CHUCK SYSTEM

CROSS-REFERENCE TO RELATED APPLICATION

This application claims priority to and the benefit of Korean Patent Application No. 10-2015-0042366, filed on Mar. 26, 2015 in the Korean Intellectual Property Office, the disclosure of which is incorporated herein in its entirety by reference.

BACKGROUND

1. Field

One or more exemplary embodiments of the inventive concept relate to an electrostatic chuck system and a method of manufacturing an organic light-emitting display apparatus by using the electrostatic chuck system.

2. Description of the Related Art

Currently, mobile electronic devices are widely used. In addition to compact electronic devices, such as mobile phones, tablet personal computers (PC) are widely used.

The mobile electronic devices provide various functions and/or functionality by including a display apparatus for providing visual information, such as an image or a video. Recently, as components for driving the display apparatus have become smaller (e.g., miniaturized), the display apparatus has gained increased significance in the electronic devices. Also, a structure in which the display apparatus is bent at a pre-determined angle from a flat state thereof has been developed.

Information disclosed in this Background section was already known to the inventors before achieving the inventive concept or is technical information acquired in the process of achieving the inventive concept. Therefore, it may contain information that does not form prior art.

SUMMARY

One or more exemplary embodiments of the inventive concept include an electrostatic chuck system and a method of manufacturing an organic light-emitting display apparatus by using the electrostatic chuck system.

Additional aspects of the inventive concept will be set forth in part in the description which follows and, in part, will be apparent from the description or may be learned by practice of the presented embodiments.

According to an embodiment of the inventive concept, an electrostatic chuck system includes: a stage in which a first electrode and a second electrode are arranged, the first electrode having a first polarity and the second electrode having a second polarity that is different from the first polarity; a display substrate on the stage, the display substrate including a pixel electrode on a surface thereof; and an optical mask over the surface of the display substrate, the optical mask including a reflection layer and a transfer layer to be transferred to the display substrate. The display substrate has one of the first and second polarities, and the optical mask has the other of the first and second polarities as the display substrate.

The electrostatic chuck system may further include a first power supply electrically connected to the display substrate and the optical mask.

A first terminal of the first power supply may be connected to the pixel electrode of the display substrate.

A second terminal of the first power supply may be connected to the reflection layer of the optical mask.

The display substrate and the optical mask may be charged using a monopolar method.

The stage may be charged using a bipolar method.

The optical mask may further include: a base plate having a transparent first surface and a second surface is opposite to the first surface and on which the reflection layer is arranged; and an insulating layer on the second surface. At least a portion of the insulating layer may surround a periphery of the reflection layer.

The optical mask may further include a light absorption layer on the insulating layer, and at least a portion of the transfer layer may contact the light absorption layer.

The reflection layer may have a patterned opening corresponding to an emission area of the display substrate.

The reflection layer may correspond to a non-emission area of the display substrate.

An overall thickness of a portion of the optical mask corresponding to an emission area of the display substrate may be less than an overall thickness of a portion of the optical mask corresponding to a non-emission area of the display substrate.

The electrostatic chuck system may further include a light source above the optical mask.

According to an embodiment of the inventive concept, a method of manufacturing an organic light-emitting display apparatus by using an electrostatic chuck system includes: forming a pixel electrode on a display substrate; forming a reflection layer and a transfer layer on an optical mask; aligning the display substrate on a stage with the optical mask; supplying a voltage to the stage to adhere the display substrate to the stage; supplying a voltage having a first polarity to the display substrate and supplying a voltage having a second polarity that is different from the first polarity to the optical mask; and forming an intermediate layer on an emission area of the display substrate by irradiating light to the optical mask to transfer the transfer layer from the optical mask to the display substrate.

The aligning of the display substrate with the optical mask may include aligning the reflection layer of the optical mask with a non-emission area of the display substrate.

The supplying of the voltage to the stage may include supplying a voltage having a first polarity to a first electrode and supplying a voltage having a second polarity that is different from the first polarity to a second electrode by using a bipolar method.

The supplying of the voltage to the display substrate and to the optical mask may include connecting the pixel electrode of the display substrate to a first power supply and connecting the reflection layer of the optical mask to the first power supply.

The pixel electrode and the reflection layer may be independently connected to the first power supply.

The supplying of the voltage to the display substrate and to the optical mask may include charging the display substrate and the optical mask by using a monopolar method.

In the forming of the intermediate layer on the emission area of the display substrate, the transfer layer may be transferred to the emission area of the display substrate as light irradiated to the optical mask is absorbed by a light absorption layer which is in contact with the transfer layer.

In the forming of the intermediate layer on the emission area of the display substrate, the transfer layer may be transferred to the emission area of the display substrate as light irradiated to the optical mask passes through a patterned opening in the reflection layer.

BRIEF DESCRIPTION OF THE DRAWINGS

These and/or other aspects of the inventive concept will become apparent and more readily appreciated from the following description of the exemplary embodiments, taken in conjunction with the accompanying drawings in which.

DETAILED DESCRIPTION

Figure 1:
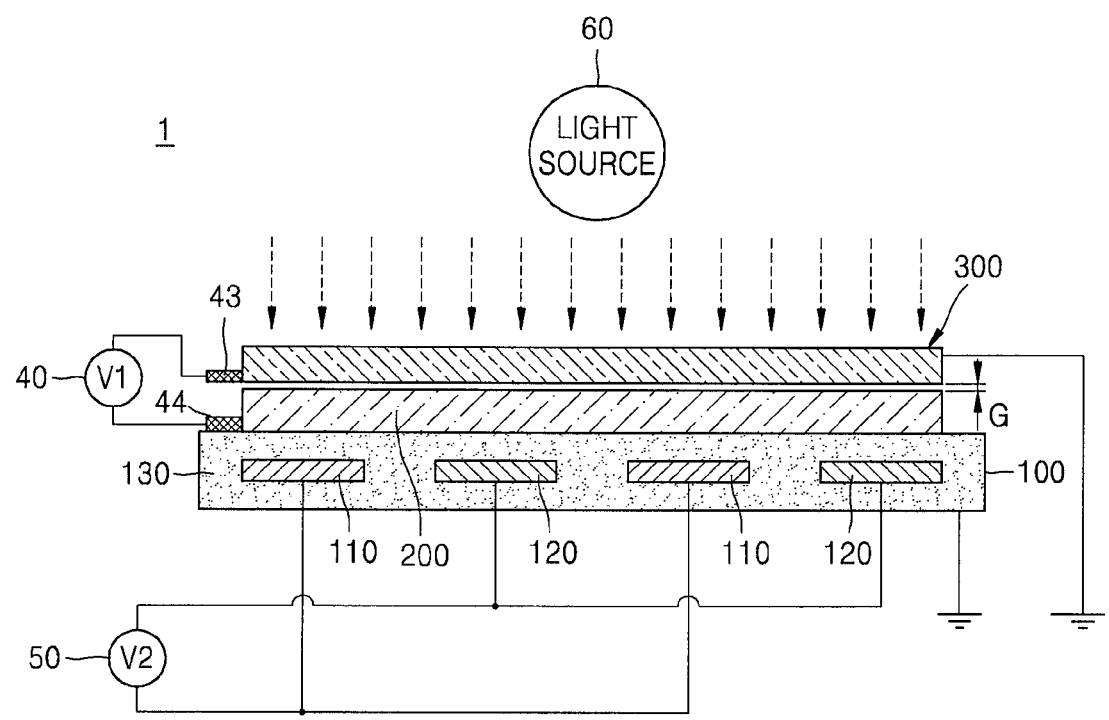
FIG. 1 is a diagram illustrating a structure of an electrostatic chuck system according to an exemplary embodiment of the inventive concept.

Reference will now be made in detail to exemplary embodiments of the inventive concept, examples of which are illustrated in the accompanying drawings, wherein like reference numerals refer to like elements throughout. In this regard, the inventive concept may have different forms and should not be construed as being limited to the descriptions set forth herein. Accordingly, the exemplary embodiments are merely described below, by referring to the figures, to explain aspects of the inventive concept. As used herein, the term "and/or" includes any and all combinations of one or more of the associated listed items. Expressions, such as "at least one of," when preceding a list of elements, modify the entire list of elements and do not modify the individual elements of the list. Further, the use of "may" when describing embodiments of the inventive concept relates to "one or more embodiments of the present invention." Also, the term "exemplary" is intended to refer to an example or illustration.

Because the inventive concept may have various modifications and several embodiments, exemplary embodiments are shown in the drawings and will be described in detail. Aspects, features, and a method of achieving the same will be specified with reference to the embodiments described below in detail together with the attached drawings. However, the embodiments may have different forms and should not be construed as being limited to the descriptions set forth herein. It will be understood that although the terms "first", "second", etc. may be used herein to describe various components, these components should not be limited by these terms. These components are only used to distinguish one component from another. Singular expressions, unless defined otherwise in context, include plural expressions. In the embodiments below, it will be further understood that the terms "include," "comprise," and/or "have" used herein specify the presence of stated features or components but do not preclude the presence or addition of one or more other features or components.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly. As used herein, the terms "use," "using," and "used" may be considered synonymous with the terms "utilize," "utilizing," and "utilized," respectively.

Also, in the drawings, for convenience of description, sizes of elements may be exaggerated or contracted. Because sizes and thicknesses of components in the drawings are arbitrarily illustrated for convenience of explanation, the following embodiments are not limited thereto. When an embodiment is implementable in another manner, a predetermined process order may be different from a described one. For example, two processes that are consecutively described may be substantially concurrently or simultaneously performed or may be performed in an opposite order to the described order.

The exemplary embodiments of the inventive concept will be described below in more detail with reference to the accompanying drawings. Those components that are the same or are in correspondence are rendered the same reference numeral regardless of the figure number, and redundant explanations thereof may be omitted.

FIG. 1 is a diagram illustrating a structure of an electrostatic chuck system according to an exemplary embodiment of the inventive concept.

Referring to FIG. 1, an electrostatic chuck system 1 may include a stage 100, a display substrate 200, an optical mask 300, a first power supply 40 (e.g., a first power supply unit), a second power supply 50 (e.g., a second power supply), and a light source 60.

The stage 100 may align the display substrate 200 and the optical mask 300 with respect to each other. A first electrode 110 having a first polarity and a second electrode 120 having a second polarity that is different from the first polarity may be disposed in the stage 100. The stage 100 may include a housing 130 surrounding the first electrode 110 and the second electrode 120 (e.g., the first and of and 120 may be embedded in the housing 130). The housing 130 may function as a dielectric material in the stage 100.

For example, when the first polarity is defined as a negative polarity, the second polarity is defined as a positive polarity, and when the first polarity is defined as a positive polarity, the second polarity is defined as a negative polarity.

The stage 100 may be charged using a bipolar method. A first terminal of the second power supply 50 may be electrically connected to the first electrode 110 so that the first electrode 110 has the first polarity. A second terminal of the second power supply 50 may be electrically connected to the second electrode 120 so that the electrostatic chuck system 1 has the second polarity.

Figure 2:
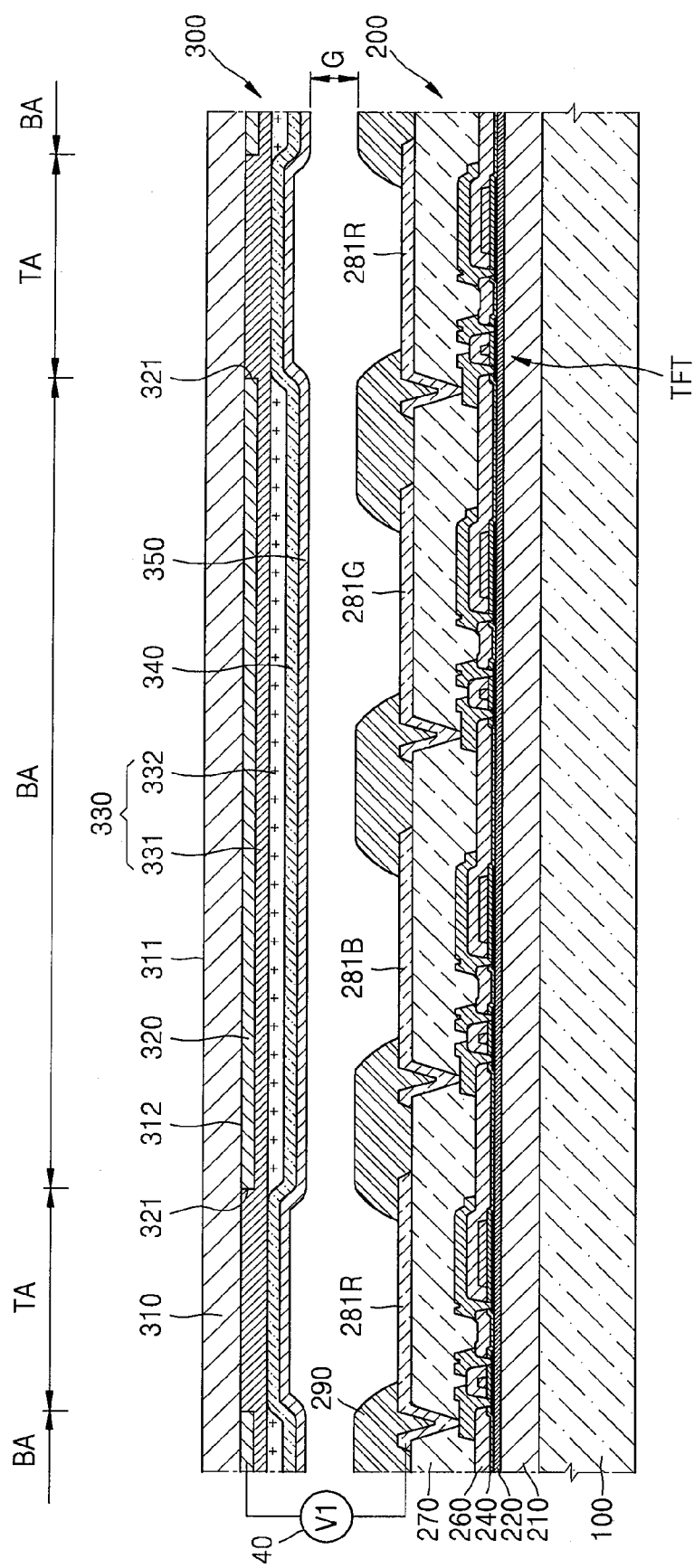
FIGS. 2 and 3 are schematic cross-sectional views illustrating processes of a method of manufacturing an organic light-emitting display apparatus according to an exemplary embodiment of the inventive concept.

The display substrate 200 is disposed on the stage 100. Referring to FIG. 2, a first surface of the display substrate 200 contacts the stage 100, and pixel electrodes 281R, 281B, and 281G are formed on a second surface of the display substrate 200. The second surface of the display substrate 200 faces the optical mask 300.

The optical mask 300 is disposed on (e.g., over) the display substrate 200. The optical mask 300 includes a transfer layer 350 on which a transfer material is deposited. The transfer layer 350 may be deposited on the display substrate 200 by light irradiated from the light source 60.

The transfer layer 350 is a layer that may be evaporated, gasified, or sublimated by heat generated in a light absorption layer 340 and may include, for example, an emission material, a hole transport material, or a hole injection material. The transfer layer 350 may also include an electron transport material or an electron injection material as desired.

The first power supply 40 may be connected to the display substrate 200 and the optical mask 300 to charge both of them. The first power supply 40 may charge the display substrate 200 and the optical mask 300 by using a monopolar method.

A first terminal of the first power supply 40 is connected to the pixel electrodes 281R, 281B, and 281G of the display substrate 200. The display substrate 200 may be charged to one of the first and second polarities by the first power supply 40. A first wiring may be used to connect the first terminal of the first power supply 40 to a first terminal 44, and when the first terminal 44 is connected to the pixel electrodes 281R, 281B, and 281G, the display substrate 200 may be charged to one of the first polarity and the second polarity.

A second terminal of the first power supply 40 is connected to a reflection layer 320 of the optical mask 300. The first power supply 40 charges the optical mask 300 to either the first polarity or the second polarity, which is different from the polarity of the display substrate 200. A second wiring is used to connect the second terminal of the first power supply 40 to a second terminal 43, and because the second terminal 43 is connected to the reflection layer 320, the optical mask 300 may be charged to the first polarity or the second polarity, which is different from the polarity of the display substrate 200.

The second power supply 50 may be connected to the stage 100 so that the stage 100 is charged using the bipolar method. A first terminal of the second power supply 50 may be connected to the first electrode 110 so that the first electrode 110 is charged to the first polarity, and a second terminal of the second power supply 50 may be connected to the second electrode 120 so that the second electrode 120 is charged to the second polarity.

The light source 60 may be above (e.g., installed above) the optical mask 300. The light source 60 may be a laser or a flash lamp. Light emitted from the light source 60 may be irradiated to the optical mask 300 so that the transfer layer 350 of the optical mask 300 is transferred to the display substrate 200.

Figure 3:
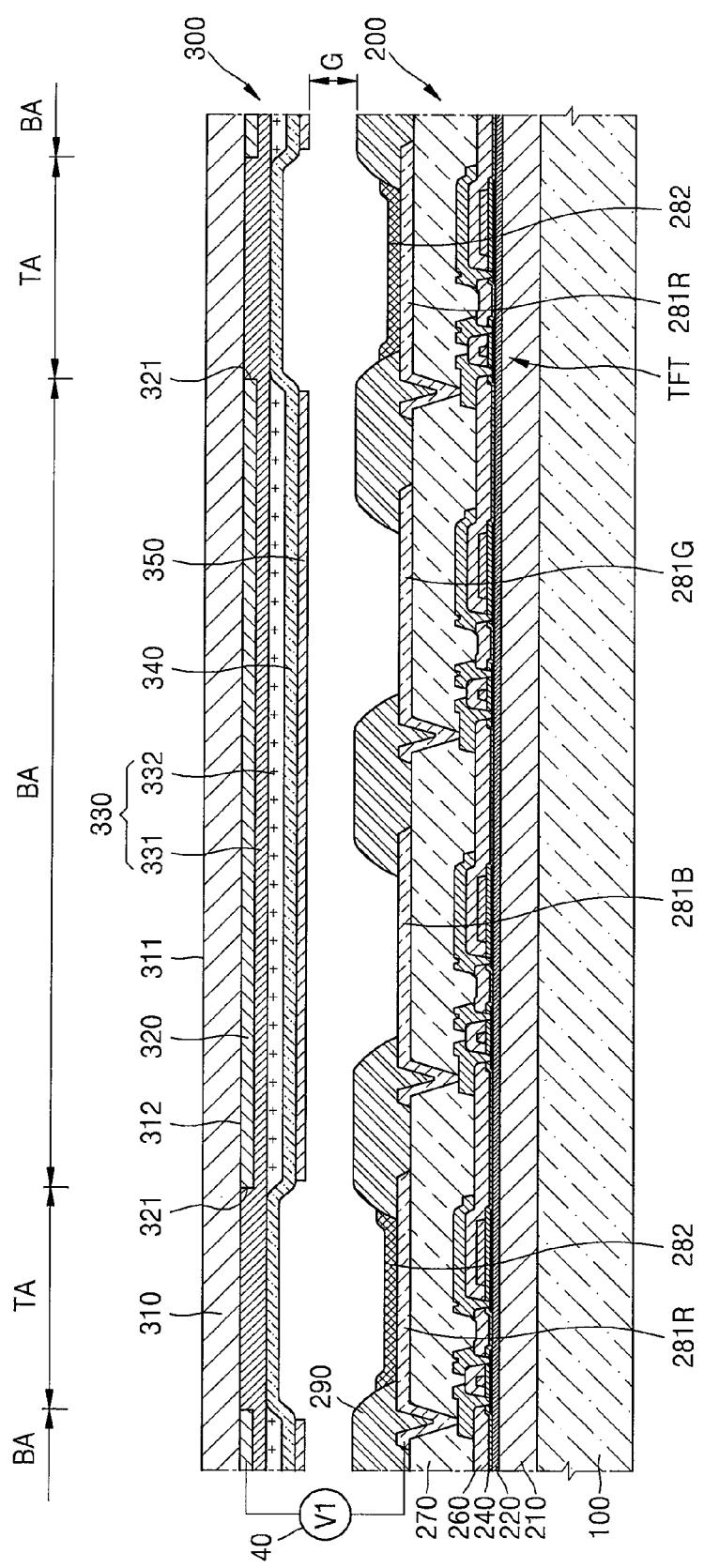
Figure 4:
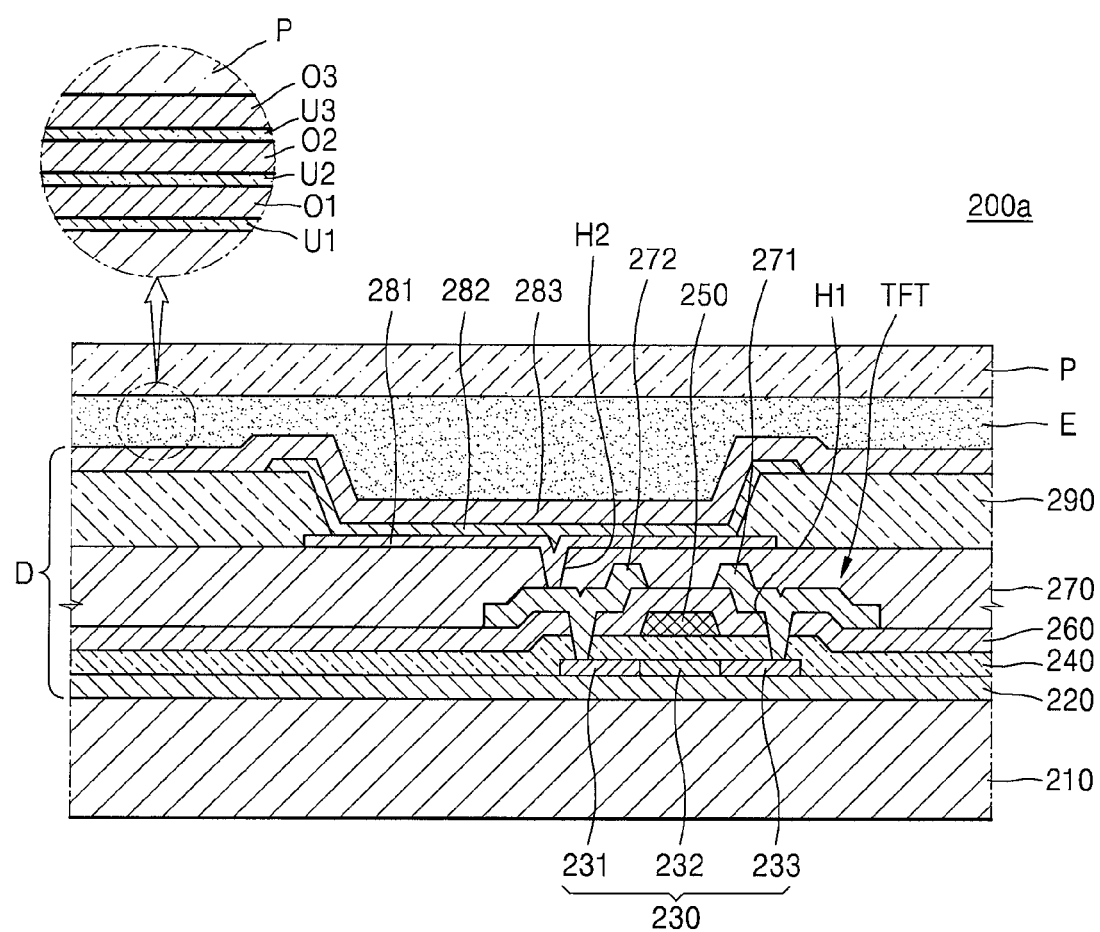
FIG. 4 is a cross-sectional view illustrating a sub-pixel of a display apparatus according to an exemplary embodiment of the inventive concept.

FIGS. 2 and 3 are schematic cross-sectional views illustrating processes of a method of manufacturing an organic light-emitting display apparatus according to an exemplary embodiment of the inventive concept. FIG. 4 is a cross-sectional view illustrating a sub-pixel of a display apparatus according to an exemplary embodiment of the inventive concept.

Sub-pixels may each include at least one thin film transistor (TFT) and an organic light-emitting device (OLED). The TFT is not limited to the structure illustrated in FIG. 4, and the number of TFTs and structure thereof may be modified in various manners.

The display apparatus 200a of FIG. 4 may be formed on the display substrate 200 of FIG. 2, on which the transfer layer 350 is transferred, by forming an opposite electrode 283, an encapsulation layer E, and a protection layer P on the display substrate 200. After forming an intermediate layer 282 in operations corresponding to FIGS. 2 and 3, the opposite electrode 283 may be deposited on the intermediate layer 282 to form a display unit D. The display apparatus 200a may be manufactured by forming the encapsulation layer E and the protection layer P on the display unit D.

A substrate 210 may be formed of a flexible insulating material. For example, the substrate 210 may be a polymer substrate formed of a material such as a polyimide (PI), a polycarbonate (PC), a polyethersulfone (PES), polyethylene terephthalate (PET), polyethylene naphthalate (PEN), a polyarylate (PAR), and/or a fiberglass reinforced plastic (FRP).

According to an exemplary embodiment of the inventive concept, the substrate 210 may be a glass substrate having a thickness that is sufficient for the glass substrate to be bent (e.g., for the glass substrate to be bendable). The substrate 210 may be formed of a metal. The substrate 210 may be transparent, semi-transparent, or opaque.

A buffer layer 220 formed of an organic compound and/or an inorganic compound may be further formed on a top surface (e.g., on the second surface) of the substrate 210. The buffer layer 220 may block oxygen and moisture from penetrating into and/or beyond the substrate 210 and may planarize a surface of the substrate 210.

The buffer layer 220 may be formed of an inorganic material, such as a silicon oxide ($SiO_x$), a silicon nitride ($SiN_x$), a silicon oxynitride ($SiO_xN_y$), an aluminum oxide ($AlO_x$), and/or an aluminum nitride ($AlO_xN_y$) or an organic material, such as acryl, polyimide, and/or polyester.

A TFT may be formed on the buffer layer 220. Although a top gate transistor is described as the TFT according to the presently described exemplary embodiment of the inventive concept, the TFT may also be a bottom gate transistor or other TFTs having a different suitable structure.

After an active layer 230 is formed on the buffer layer 220 in a pattern (e.g., a predetermined pattern), the active layer 230 is covered by (e.g., buried by) a gate insulating layer 240. The active layer 230 includes a source region 231 and a drain region 233, and a channel region 232 is further included between the source region 231 and the drain region 233.

The active layer 230 may be formed of various materials. For example, the active layer 230 may include an inorganic semiconductor material, such as amorphous silicon and/or crystalline silicon. As another example, the active layer 230 may include an oxide semiconductor. For example, the oxide semiconductor may include a metal element of Group 12, 13, or 14, such as zinc (Zn), indium (In), gallium (Ga), tin (Sn), cadmium (Cd), germanium (Ge), and/or hafnium (Hf) or an oxide of a material selected from a combination of two or more of these materials. However, for convenience of description, the below description will primarily focus on an exemplary embodiment in which the active layer 230 is formed of amorphous silicon.

A gate electrode 250 is formed on a top surface of the gate insulating layer 240 to correspond to the active layer 230 and an interlayer insulating layer 260 is formed on the gate electrode 250, thus covering (e.g., burying) the gate electrode 250.

After forming a contact opening H1 (e.g., a contact hole) in the interlayer insulating layer 260 and the gate insulating layer 240, a source electrode 271 and a drain electrode 272 are both formed on the interlayer insulating layer 260 to respectively contact the source region 231 and the drain region 233.

A passivation layer 270 is formed on the TFT formed as described above, and a pixel electrode 281 of the OLED is formed on the passivation layer 270.

The pixel electrode 281 may be a semi-transparent electrode, a transparent electrode, or a reflective electrode. When the pixel electrode 281 is a semi-transparent electrode or a transparent electrode, the pixel electrode 281 may be formed of, for example, indium tin oxide (ITO), indium zinc oxide (IZO), zinc oxide (ZnO), indium oxide ($In_2O_3$), indium gallium oxide (IGO), and/or aluminum zinc oxide (AZO). When the pixel electrode 281 is formed as a reflective electrode, the pixel electrode 281 may include a reflective layer formed of, for example, Ag, Mg, Al, Pt, Pd, Au, Ni, Nd, Ir, Cr, and/or a compound of two or more of these and a layer formed of ITO, IZO, ZnO, or $In_2O_3$. However, the composition and materials of the pixel electrode 281 are not limited thereto, and the pixel electrode 281 may be formed in various manners.

The pixel electrode 281 contacts the drain electrode 272 of the TFT through a via opening H2 (e.g., a via hole) formed in the passivation layer 270. The passivation layer 270 may be formed as an inorganic layer and/or an organic layer and may be a single layer or may have two or more layers. The passivation layer 270 may be a planarization layer having a top surface that is planar regardless of unevenness of a lower layer therebelow or may have a top surface that is uneven according to unevenness of the lower layer. Also, the passivation layer 270 may be formed of a transparent insulating material to obtain resonance effects.

After forming the pixel electrode 281 on the passivation layer 270, a pixel-defining layer 290 is formed of an organic material and/or an inorganic material to cover the pixel electrode 281 (e.g., to cover a periphery of the pixel electrode 281) and the passivation layer 270. The pixel-defining layer 290 has an opening that exposes the pixel electrode 281.

Referring to FIGS. 2 and 3, the pixel-defining layer 290 may define pixels or sub-pixels as the pixel-defining layer 290 includes openings respectively corresponding to sub-pixels and openings that expose a center portion of each of the pixel electrodes 281R, 281B, and 281G or the entire pixel electrodes 281R, 281B, and 281G. Also, the pixel-defining layer 290 may increase a distance between edges of the pixel electrodes 281R, 281B, and 281G and the opposite electrode 283 on the pixel electrodes 281R, 281B, and 281G, thereby reducing or preventing an arc caused at the edges of the pixel electrodes 281R, 281B, and 281G.

Referring to FIG. 3, the pixel electrodes 281R, 281B, and 281G may be connected to the first power supply 40 so as to charge the display substrate 200 to a first polarity. The pixel electrodes 281R, 281B, and 281G are formed of a conductive material, and thus, a current may be supplied from the first power supply 40.

Referring to FIGS. 2 and 3, the optical mask 300 may include a base plate 310, a reflection layer 320, an insulating layer 330, a light absorption layer 340, and a transfer layer 350.

The base plate 310 includes a first surface 311 to which light is radiated from the light source 60 and a second surface 312 facing the display substrate 200. The reflection layer 320 may be formed on the second surface 312. The base plate 310 may be formed of a material through which light may be transmitted, for example, a material such as glass or quartz.

The reflection layer 320 may be formed on the second surface 312 of the base plate 310. The reflection layer 320 may reflect light that has transmitted through the base plate 310. The reflection layer 320 may include a plurality of openings 321 corresponding to an emission area of the display substrate 200. Accordingly, the reflection layer 320 has a transmission area TA corresponding to the openings 321 and a block area BA corresponding to the rest of the reflection layer 320 where the openings 321 are not formed.

The reflection layer 320 may be formed as a conductive thin film having excellent reflection characteristics. For example, the reflection layer 320 may be formed of aluminum (Al), copper (Cu), silver (Ag), molybdenum (Mo), titanium (Ti), an alloy of these, and/or a chromium nitride (CrN). The reflection layer 320 may be connected to the first power supply 40 so as to charge the optical mask 300.

The insulating layer 330 may cover the reflection layer 320 and the openings 321. The insulating layer 330 may include a first insulating layer 331 that planarizes the reflection layer 320 and a second insulating layer 332 disposed to correspond to (e.g., to be aligned with) the reflection layer 320. The insulating layer 330 may be formed of an insulating material, such as a polymer. The insulating layer 330 may function as a dielectric material between the display substrate 200 and the optical mask 300.

The first insulating layer 331 may be formed to cover the openings 321 and the reflection layer 320 and has a planar surface. The second insulating layer 332 may be divided into a portion that corresponds to the transfer layer 350 to be transferred and a portion that corresponds to the transfer layer 350 that is not transferred, and because a step is formed in the transfer layer 350 due to the second insulating layer 332 (e.g., due to the presence of the second insulating layer 332), the transfer layer 350 may be easily transferred.

The second insulating layer 332 is formed to correspond to the reflection layer 320. The reflection layer 320 is aligned with a non-emission area of the display substrate 200, and thus, a portion of the transfer layer 350 on the second insulating layer 332 is not transferred. For example, the second insulating layer 332 may be formed to correspond to the pixel-defining layer 290.

The number of second insulating layers 332 is not limited, and a plurality of second insulating layers 332 may be included. For example, a plurality of patterned insulating layers may be formed on the light absorption layer 340. However, for convenience of description, the below description will primarily focus on an exemplary embodiment in which one patterned layer is formed as the second insulating layer 332.

The transfer layer 350 may be transferred as the light absorption layer 340 absorbs light irradiated from the light source 60. The light absorption layer 340 may be formed to contact the insulating layer 330. The light absorption layer 340 corresponding to the transmission area TA of the display substrate 200 (e.g., a portion of the light absorption layer 340 corresponding to the transmission area TA) may be formed to contact the first insulating layer 331, and the light absorption layer 340 corresponding to the block area BA of the display substrate 200 (e.g., a portion of the light absorption layer 340 corresponding to the block area BA) may be formed to contact the second insulating layer 332.

The light absorption layer 340 may be formed of a material having an excellent light absorption ratio. For example, the light absorption layer 340 may be formed of a three-layer structure of chromium (Cr)/indium tin oxide (ITO)/chromium (Cr).

The transfer layer 350 may be formed on the light absorption layer 340. The transfer layer 350 may be a material that is transferred to the emission area of the display substrate 200. At least a portion of the transfer layer 350 may contact the light absorption layer 340.

According to the present exemplary embodiment, although an organic emission layer included in the organic light-emitting display apparatus is described as the transfer layer 350, the transfer layer 350 may be various functional layers included in a hole injection layer, a hole transport layer, an electron transport layer, and/or an electron injection layer.

Figure 5:
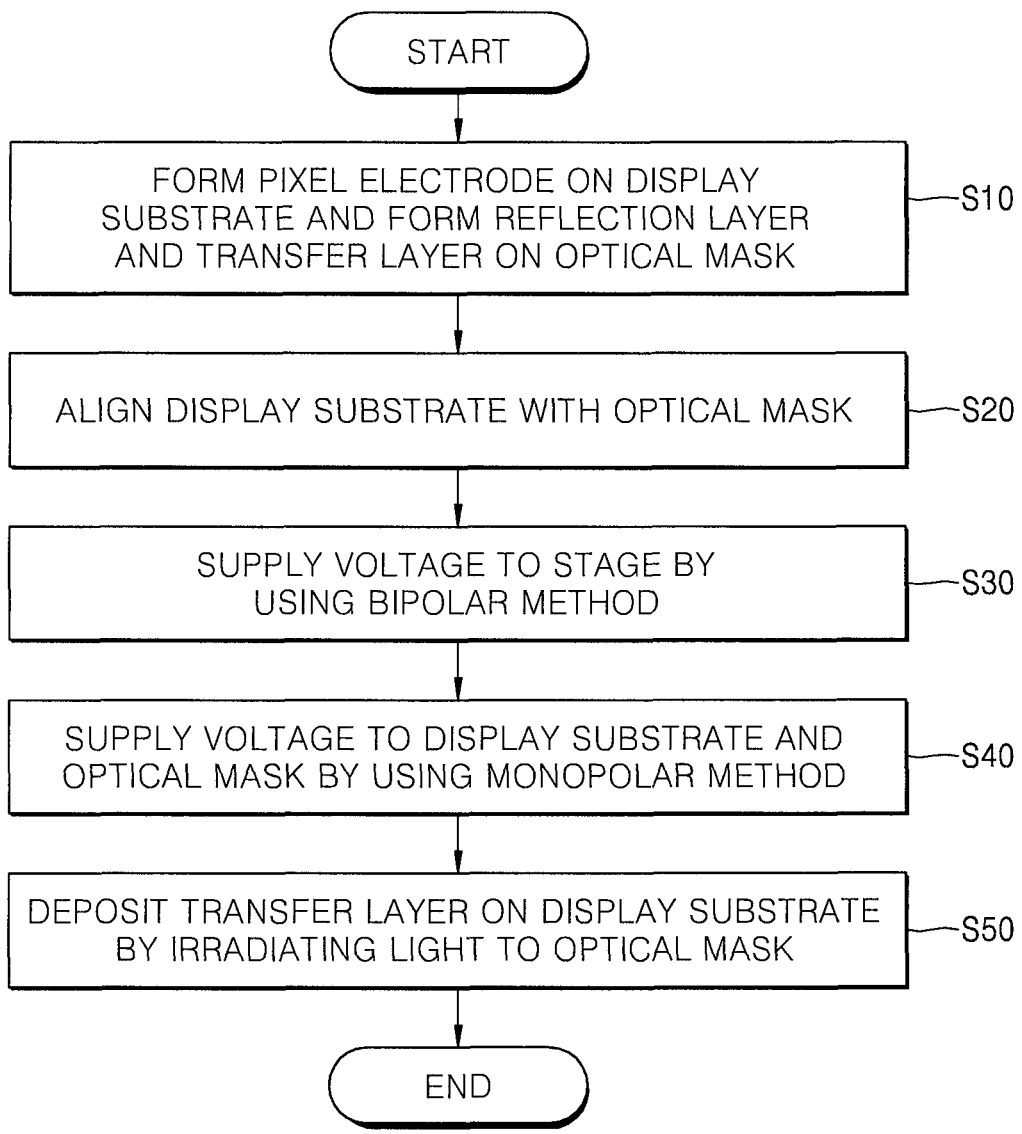
FIG. 5 is a flowchart of an operation of forming an intermediate layer on a display substrate by using the electrostatic chuck system illustrated in FIG. 1.

FIG. 5 is a flowchart of an operation of forming the intermediate layer 282 on the display substrate 200 by using the electrostatic chuck system 1 illustrated in FIG. 1.

The operation of transferring the transfer layer 350 to the display substrate 200 is described with reference to FIGS. 2, 3, and 5.

According to the embodiment illustrated in FIGS. 2 and 3, the transfer layer 350 is a transfer material transferred to the pixel electrode 281R of a red sub-pixel. However, the inventive concept is not limited thereto, and when a pattern of the opening 321 in the reflection layer 320 is changed (e.g., varied), the transfer layer 350 may be transferred to the pixel electrode 281G of a green sub-pixel and/or to the pixel electrode 281B of a blue sub-pixel. Also, the transfer layer 350 may be transferred to at least two pixel electrodes from among red, green, and blue sub-pixels according to a material to be transferred. However, for convenience of description, the below description will primarily focus on an exemplary embodiment in which the transfer layer 350 is transferred to the pixel electrode 281R of a red sub-pixel.

The pixel electrodes 281R, 281B, and 281G are formed on the display substrate 200 and the reflection layer 320 and the transfer layer 350 are formed on the optical mask 300 in operation S10.

The display substrate 200 on the stage 100 and the optical mask 300 are aligned with each other in operation S20. The reflection layer 320 of the optical mask 300 is aligned to correspond to a non-emission area of the display substrate 200. For example, the block area BA is aligned so as to correspond to the non-emission area. In one embodiment, the display substrate 200 and the optical mask 300 are aligned with each other so that the opening 321 corresponds to the pixel electrode 281R of the red sub-pixel and so that the reflection layer 320 corresponds to the rest of the area (e.g., corresponds to the pixel electrodes 281B and 281G of the blue and green sub-pixels).

A voltage is supplied to the stage 100 so that the stage 100 and the display substrate 200 are closely adhered to each other in operation S30. An electrostatic chuck is formed on the stage 100 (e.g., is activated or energized) by using a bipolar method. When a voltage is supplied to the stage 100 from the second power supply 50, the stage 100 may apply an attractive force to the display substrate 200 so that the display substrate 200 is closely adhered to the stage 100.

A voltage is supplied to the display substrate 200 and the optical mask 300 in operation S40. The pixel electrodes 281R, 281B, and 281G of the display substrate 200 and the reflection layer 320 of the optical mask 300 are connected to the first power supply 40. The display substrate 200 is charged to a different polarity than the optical mask 300 so that there is an attractive force between each other. For example, the display substrate 200 and the optical mask 300 may be charged using a monopolar method so that a gap G between the display substrate 200 and the optical mask 300 is reduced or minimized.

The transfer layer 350 of the optical mask 300 may be transferred to the display substrate 200 in operation S50. The intermediate layer 282 may be formed by transferring the transfer layer 350 deposited on the optical mask 300 to the display substrate 200 by irradiating light to the optical mask 300.

Referring back to FIG. 4, the intermediate layer 282 may be formed on the pixel electrode 281R of the display substrate 200 by using the transfer layer 350. When light is irradiated from the light source 60 while the display substrate 200 and the optical mask 300 are aligned with each other, light that has transmitted through the opening 321 may react with the light absorption layer 340 to thereby transfer the transfer layer 350 such that the intermediate layer 282 is transferred onto the pixel electrode 281R of the red sub-pixel.

The intermediate layer 282 may include an organic emission layer. In another embodiment, the intermediate layer 282 may include an organic emission layer and also a hole injection layer, a hole transport layer, an electron transport layer, and/or an electron injection layer in addition to the organic emission layer.

Then, the opposite electrode 283 is formed on the intermediate layer 282. The pixel electrode 281 functions as an anode electrode, and the opposite electrode 283 functions as a cathode electrode. However, polarities of the pixel electrode 281 and the opposite electrode 283 may be exchanged.

The pixel electrode 281 and the opposite electrode 283 may be insulated from each other via the intermediate layer 282. As voltages of different polarities are respectively supplied from the pixel electrode 281 and the opposite electrode 283 to the intermediate layer 282, light is emitted from the organic emission layer.

While an organic emission layer is formed of additional emission material for each pixel in the above-described embodiment, the inventive concept is not limited thereto. The organic emission layer may be commonly formed with respect to all of the pixels regardless of position thereof. The organic emission layer may be formed of vertically stacked layers that include emission materials emitting light of red, green, and blue color or may be formed by mixing the materials emitting light of red, green, and blue color. As long as white color light is emitted, combination of other colors is also possible. Also, the display unit D may further include a color converting layer that converts the emitted white color light into a certain color (e.g., a predetermined color) or may include a color filter.

After the display unit D is formed on the substrate 210, an encapsulation layer E may be formed on the display unit D. The encapsulation layer E may include a plurality of inorganic layers or may include an inorganic layer and an organic layer, For example, an organic layer of the encapsulation layer E may be formed of a polymer, for example, of a single layer or as stacked layers formed of polyethylene terephthalate, a polyimide, a polycarbonate, an epoxy, a polyethylene, and/or a polyacrylate. The organic layer may be formed of polyacrylate; for example, the organic layer may include a polymerized monomer composition including a diacrylate-based monomer and a triacrylate-based monomer. The monomer composition may further include a monoacrylate-based monomer. Also, the monomer composition may further include a well-known photo-initiator, such as TPO, but is not limited thereto and may include, for example, an epoxy, a polyimide, polyethylene terephthalate, a polycarbonate, a polyethylene, and/or a polyacrylate.

An inorganic layer of the encapsulation layer E may be a single layer or stacked layers including a metal oxide and/or a metal nitride. For example, the inorganic layer may include a silicon oxide (e.g., $SiO_2$), a silicon nitride ($SiN_x$), an aluminum oxide (e.g., $Al_2O_3$), a titanium oxide (e.g., $TiO_2$), a zirconium oxide ($ZrO_x$), and/or a zinc oxide (e.g., ZnO).

An uppermost layer that is included in the encapsulation layer E and is exposed to the outside may be formed as an inorganic layer so as to prevent penetration of moisture into the display unit D.

The encapsulation layer E may include at least one sandwich structure in which at least one organic layer is between (e.g., is inserted between) at least two inorganic layers. As another example, the encapsulation layer E may include at least one sandwich structure in which at least one inorganic layer is between (e.g., is inserted between) at least two organic layers. For example, the encapsulation layer E may include, sequentially from an upper portion of the display unit D, a first inorganic layer U1, a first organic layer O1, a second inorganic layer U2, a second organic layer O2, a third inorganic layer U3, and a third organic layer O3.

A halogenated metal layer including LiF may be included between the display unit D and the first inorganic layer U1. The halogenated metal layer may prevent damage to the display unit D when forming the first inorganic layer U1 by using a sputtering method.

The first organic layer O1 may have a smaller area than the second inorganic layer U2, and the second organic layer O2 may have a smaller area than the third inorganic layer U3.

The encapsulation layer E is not limited to the above-described structure and may have any structure in which inorganic layers and organic layers are stacked in various forms.

The protection layer P may be formed on the encapsulation layer E. The protection layer P may be formed using various methods. For example, the protection layer P may be formed using a sputtering method, an ion beam deposition method, an evaporation method, or a chemical vapor deposition (CVD) method.

The protection layer P may include a metal oxide and/or a metal nitride, such as silicon nitride ($SiN_x$), silicon oxynitride ($SiO_xN_y$), titanium oxide ($TiO_x$), titanium nitride ($TiN_x$), titanium oxynitride ($TiO_xN_y$), zirconium oxide ($ZrO_x$), tantalum nitride ($TaN_x$), tantalum oxide ($TaN_x$), hafnium oxide ($HfO_x$), and/or aluminum oxide ($AlO_x$).

The protection layer P may be formed to completely surround lateral sides of the encapsulation layer E. Thus, the protection layer P may block the encapsulation layer E from water or oxygen, thereby increasing the lifespan of the encapsulation layer E.

Figure 6:
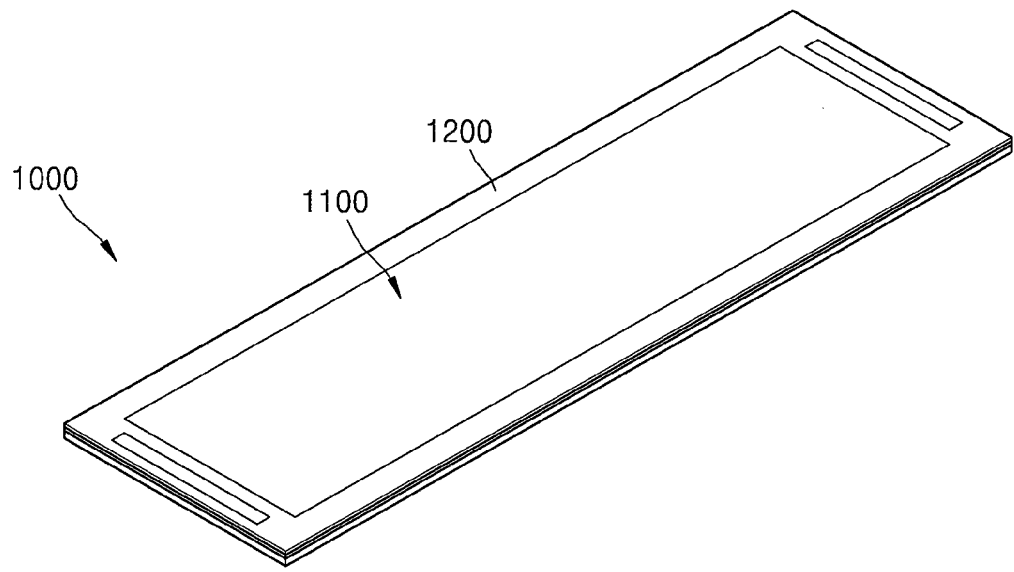
FIG. 6 is a perspective view illustrating a display apparatus in an unfolded state according to an exemplary embodiment of the inventive concept.
Figure 7:
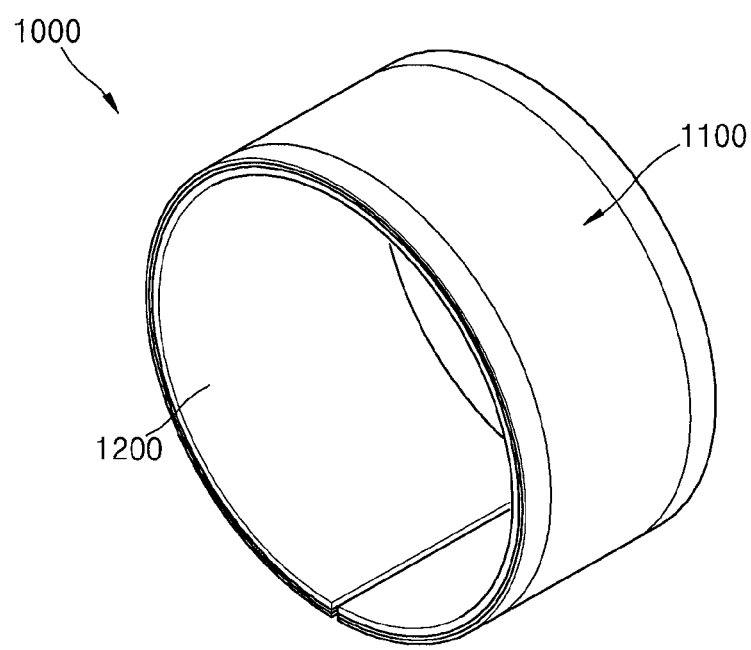
FIG. 7 is a perspective view illustrating the display apparatus illustrated in FIG. 6 in a wound state.

FIG. 6 is a perspective view illustrating a display apparatus 1000 in an unfolded state according to an exemplary embodiment of the inventive concept. FIG. 7 is a perspective view illustrating the display apparatus 1000 illustrated in FIG. 6 in a wound (e.g., bent) state.

The display apparatus 1000 described herein is a flexible display apparatus but may alternatively be a rigid display apparatus.

Referring to FIGS. 6 and 7, the display apparatus 1000 includes a flexible display panel 1100 for displaying an image and a flexible case 1200 accommodating the flexible display panel 1100. The flexible display panel 1100 may include not only elements for implementing an image screen but also other various elements and/or films, such as a touch screen, a polarization plate, and/or a window cover. The display apparatus 1000 may be used to view an image at various angles, for example, when the display apparatus 1000 is unfolded (e.g., planar) or bent.

The flexible display panel 1100 may be formed by using a transfer layer that is transferred using the electrostatic chuck system 1. According to the present exemplary embodiment, although an organic light-emitting display apparatus is described as the display apparatus 1000, the display apparatus 1000 may also be other various flexible display apparatuses, such as a liquid crystal display, a field emission display, or an electronic paper display.

The optical mask 300 is aligned with the display substrate 200 in order to deposit the transfer layer 350. A gap G between the optical mask 300 and the display substrate 200 is reduced or minimized in order to precisely transfer the transfer layer 350.

The electrostatic chuck system 1 charges the stage 100 by using a bipolar method to thereby precisely transfer the transfer layer 350 by reducing or minimizing separation between the stage 100 and the display substrate 200.

The electrostatic chuck system 1 may charge the display substrate 200 and the optical mask 300 by using a monopolar method to closely adhere the optical mask 300 to the display substrate 200. The electrostatic chuck system 1 may precisely transfer the transfer layer 350 to the display substrate 200 by reducing or minimizing the gap between the display substrate 200 and the optical mask 300.

The electrostatic chuck system 1 may reduce or prevent bending of the display substrate 200 or the optical mask 300. When the transfer layer 350 is transferred to the emission area of the display substrate 200, the display substrate 200 and/or the optical mask 300 may deform due to a stress formed in the display substrate 200 or the optical mask 300. The electrostatic chuck system 1 charges the display substrate 200 and the optical mask 300, and thus, the display substrate 200 and the optical mask 300 may be maintained flat.

According to the method of manufacturing an organic light-emitting display apparatus by using the electrostatic chuck system 1, a transfer material may be precisely transferred to the display substrate 200, thereby providing a high-quality display apparatus and improving efficiency of manufacturing the same.

According to the electrostatic chuck system and the method of manufacturing an organic light-emitting display apparatus by using the electrostatic chuck system according the one or more embodiments of the inventive concept, efficiency and precision of the display apparatus may be improved by reducing or minimizing a gap between an optical mask and a display substrate. However, the scope of the inventive concept is not limited thereto.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims and their equivalents.

What is claimed is:

1. A method of manufacturing an organic light-emitting display apparatus by using an electrostatic chuck system, the method comprising:

forming a pixel electrode on a display substrate;

forming a reflection layer and a transfer layer on an optical mask;

aligning the display substrate on a stage with the optical mask;

supplying a voltage to the stage to adhere the display substrate to the stage;

supplying a voltage having a first polarity to the display substrate and supplying a voltage having a second polarity that is different from the first polarity to the optical mask; and forming an intermediate layer on an emission area of the display substrate by irradiating light to the optical mask to transfer the transfer layer from the optical mask to the display substrate.

2. The method of claim 1, wherein the aligning of the display substrate with the optical mask comprises aligning the reflection layer of the optical mask with a non-emission area of the display substrate.

3. The method of claim 1, wherein the supplying of the voltage to the stage comprises supplying a voltage having a first polarity to a first electrode and supplying a voltage having a second polarity that is different from the first polarity to a second electrode by using a bipolar method.

4. The method of claim 1, wherein the supplying of the voltage to the display substrate and to the optical mask comprises connecting the pixel electrode of the display substrate to a first power supply and connecting the reflection layer of the optical mask to the first power supply.

5. The method of claim 4, wherein the pixel electrode and the reflection layer are independently connected to the first power supply.

6. The method of claim 1, wherein the supplying of the voltage to the display substrate and to the optical mask comprises charging the display substrate and the optical mask by using a monopolar method.

7. The method of claim 1, wherein in the forming of the intermediate layer on the emission area of the display substrate, the transfer layer is transferred to the emission area of the display substrate as light irradiated to the optical mask is absorbed by a light absorption layer which is in contact with the transfer layer.

8. The method of claim 7, wherein in the forming of the intermediate layer on the emission area of the display substrate, the transfer layer is transferred to the emission area of the display substrate as light irradiated to the optical mask passes through a patterned opening in the reflection layer.

* * * * *